United States Patent
Wang et al.

(10) Patent No.: US 10,276,603 B2
(45) Date of Patent: Apr. 30, 2019

(54) ARRAY SUBSTRATE AND REPAIRING METHOD THEREOF

(71) Applicant: BOE TECHNOLOGY GROUP CO., LTD., Beijing (CN)

(72) Inventors: Ming Wang, Beijing (CN); Jun Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/567,193

(22) PCT Filed: Oct. 14, 2016

(86) PCT No.: PCT/CN2016/102099
§ 371 (c)(1),
(2) Date: Oct. 17, 2017

(87) PCT Pub. No.: WO2018/068298
PCT Pub. Date: Apr. 19, 2018

(65) Prior Publication Data
US 2018/0294289 A1 Oct. 11, 2018

(51) Int. Cl.
*H01L 27/12* (2006.01)
*G02F 1/1362* (2006.01)
*H01L 21/66* (2006.01)

(52) U.S. Cl.
CPC .... *H01L 27/1244* (2013.01); *G02F 1/136259* (2013.01); *H01L 22/22* (2013.01);
(Continued)

(58) Field of Classification Search
CPC  H01L 27/1244; H01L 22/22; G02F 1/136259
See application file for complete search history.

(56) References Cited

U.S. PATENT DOCUMENTS 7,515,243 B2 *  4/2009  Watamura ......... G02F 1/136259
                                                  349/192
8,083,561 B1 * 12/2011  Huang ............. G02F 1/136259
                                                  345/76
(Continued)

FOREIGN PATENT DOCUMENTS

| CN | 1877844 A | 12/2006 |
| CN | 101051645 A | 10/2007 |
| CN | 105527736 A | 4/2016 |

OTHER PUBLICATIONS

International Search Report & Written Opinion dated Jul. 27, 2017, regarding PCT/CN2016/102099.

*Primary Examiner* — William Coleman
(74) *Attorney, Agent, or Firm* — Intellectual Valley Law, P.C.

(57) ABSTRACT

The present application discloses an array substrate including a first signal line layer having a plurality of rows of first signal lines; a second signal line layer having a plurality of columns of second signal lines; the plurality of rows of first signal lines crossing over the plurality of columns of second signal lines defining a plurality of subpixels; a first insulating layer and a second insulating layer between the first signal line layer and the second signal line layer; the first insulating layer on a side of the second insulating layer proximal to the first signal line layer; a repair line between the first insulating layer and the second insulating layer, the repair line corresponding to one of the plurality of columns of second signal lines; and a first via and a second via extending through the second insulating layer; the repair line being electrically connected to the corresponding one of the plurality of columns of second signal lines through the first via and the second via, respectively.

20 Claims, 12 Drawing Sheets

(52) U.S. Cl.
CPC .............. *H01L 27/1262* (2013.01); *G02F 2001/136263* (2013.01); *G02F 2201/506* (2013.01); *H01L 27/12* (2013.01)

(56) References Cited

U.S. PATENT DOCUMENTS

| | | | |
|---|---|---|---|
| 8,227,977 B2* | 7/2012 | Lhee ............... | H01L 51/0021 257/E21.596 |
| 8,610,840 B2* | 12/2013 | Kwon ............... | G02F 1/13452 349/192 |
| 2004/0041959 A1* | 3/2004 | Yoo ............... | G02F 1/136204 349/43 |

\* cited by examiner

ARRAY SUBSTRATE AND REPAIRING METHOD THEREOF

CROSS-REFERENCE TO RELATED APPLICATION

This application is a national stage application under 35 U.S.C. § 371 of International Application No. PCT/CN2016/102099, filed Oct. 14, 2016, the contents of which are incorporated by reference in the entirety.

TECHNICAL FIELD

The present invention relates to display technology, more particularly, to an array substrate, a display panel and a display apparatus having the same, a repairing method and a fabricating method thereof.

BACKGROUND

Display panels include a number of various types of signal lines, e.g., data lines, gate lines, and touch control lines. These signal lines provide voltage signals essential to the image display function of the display panels. For example, the data lines provide data signals to the subpixels in the display panels, and the gate lines provides gate scanning signals to each row of subpixels in the display panels. When a signal line is damaged, e.g., having an open circuit, the voltage signal cannot be transmitted to the damaged signal line. As a result, the subpixels along the damaged signal line cannot receive voltage signal for image display, resulting in dark line defect. Similarly, when there is a short circuit between adjacent signal lines, e.g., a data-gate short circuit, image display defects occur.

SUMMARY

In one aspect, the present disclosure provides an array substrate comprising a first signal line layer comprising a plurality of rows of first signal lines; a second signal line layer comprising a plurality of columns of second signal lines; the plurality of rows of first signal lines crossing over the plurality of columns of second signal lines defining a plurality of subpixels; a first insulating layer and a second insulating layer between the first signal line layer and the second signal line layer; the first insulating layer on a side of the second insulating layer proximal to the first signal line layer; a repair line between the first insulating layer and the second insulating layer, the repair line corresponding to one of the plurality of columns of second signal lines; and a first via and a second via extending through the second insulating layer; wherein the repair line is electrically connected to the corresponding one of the plurality of columns of second signal lines through the first via and the second via, respectively.

Optionally, the repair line is substantially parallel to the corresponding one of plurality of columns of second signal lines.

Optionally, the repair line crosses over one of the plurality of rows of first signal lines; and projections of the first via and the second via on the array substrate are on two sides of that of the one of the plurality of rows of first signal lines crossing over the repair line.

Optionally, a projection of the repair line on the array substrate substantially overlaps with that of the corresponding one of the plurality of columns of second signal lines.

Optionally, the repair line comprises a first portion, a second portion and a third portion; a projection of the first via on the array substrate substantially overlaps with those of the first portion and the corresponding one of the plurality of columns of second signal lines; a projection of the second via on the array substrate substantially overlaps with those of the second portion and the corresponding one of the plurality of columns of second signal lines; and a projection of the third portion on the array substrate is spaced apart from that of the corresponding one of the plurality of columns of second signal lines.

Optionally, the repair line crosses over one of the plurality of rows of first signal lines; the repair line comprises a first portion, a second portion and a third portion; projections of the first via and the second via on the array substrate are on two sides of that of the one of the plurality of rows of first signal lines crossing over the repair line; a projection of the first via on the array substrate substantially overlaps with those of the first portion and the corresponding one of the plurality of columns of second signal lines; a projection of the second via on the array substrate substantially overlaps with those of the second portion and the corresponding one of the plurality of columns of second signal lines; and a projection of the third portion on the array substrate is spaced apart from that of the corresponding one of the plurality of columns of second signal lines.

Optionally, wherein the array substrate comprises a plurality of the repairs lines between the first insulating layer and the second insulating layer; and a plurality of first vias and second vias corresponding to the plurality of the repair lines; wherein each of the plurality of first vias extends through the second insulating layer; each of the plurality of second vias extends through the second insulating layer; and each of the plurality of the repair lines is electrically connected to a second signal line through a corresponding pair of first via and second via, respectively.

Optionally, the first signal line layer is a gate line layer comprising a plurality of rows of gate lines; and the second signal line layer is a data line layer comprising a plurality of columns of data lines.

Optionally, the first signal line layer is a data line layer comprising a plurality of rows of data lines; and the second signal line layer is a gate line layer comprising a plurality of columns of gate lines.

In another aspect, the present disclosure provides a method of repairing a signal line short circuit between the corresponding one of the plurality of columns of second signal lines and the one of the plurality of rows of first signal lines crossing over the repair line in an array substrate described herein, the method comprising electrically disconnecting the corresponding one of the plurality of columns of second signal lines from the one of the plurality of rows of first signal lines crossing over the repair line.

Optionally, the step of electrically disconnecting comprises cutting the corresponding one of the plurality of columns of second signal lines at a first cutting position and a second cutting position; a projection of the first cutting position on the array substrate is between those of the first via and the one of the plurality of rows of first signal lines crossing over the repair line; and a projection of the second cutting position on the array substrate is between those of the second via and the one of the plurality of rows of first signal lines crossing over the repair line.

Optionally, the repair line crosses over one of the plurality of rows of first signal lines; the repair line comprises a first portion, a second portion and a third portion; projections of the first via and the second via on the array substrate are on two sides of that of the one of the plurality of rows of first signal lines crossing over the repair line; a projection of the first via on the array substrate substantially overlaps with those of the first portion and the corresponding one of the plurality of columns of second signal lines; a projection of the second via on the array substrate substantially overlaps with those of the second portion and the corresponding one of the plurality of columns of second signal lines; a projection of the third portion on the array substrate is spaced apart from that of the corresponding one of the plurality of columns of second signal lines; and projections of the first cutting position and the second cutting position on the array substrate overlap with that of the third portion, respectively.

Optionally, the signal line short circuit is a data-gate short circuit between a gate line and a data line; and the corresponding one of the plurality of columns of second signal lines and the one of the plurality of rows of first signal lines crossing over the repair line are two different signal lines selected from a gate line and a data line.

In another aspect, the present disclosure provides a method of fabricating an array substrate, the method comprising forming a first signal line layer comprising a plurality of rows of first signal lines; and a second signal line layer comprising a plurality of columns of second signal lines; the plurality of rows of first signal lines crossing over the plurality of columns of second signal lines defining a plurality of subpixels; forming a first insulating layer and a second insulating layer between the first signal line layer and the second signal line layer; the first insulating layer on a side of the second insulating layer proximal to the first signal line layer; forming a repair line between the first insulating layer and the second insulating layer, the repair line corresponding to one of the plurality of columns of second signal lines; and forming a first via and a second via extending through the second insulating layer; wherein the repair line is formed to be electrically connected to the corresponding one of the plurality of columns of second signal lines through the first via and the second via, respectively.

Optionally, the method comprising sequentially forming a first signal line layer comprising a plurality of rows of first signal lines on a base substrate; forming a first insulating layer on a side of the first signal line layer distal to the base substrate; forming a repair line on a side of the first insulating layer distal to the first signal line layer; forming a second insulating layer on a side of the repair line distal to the first insulating layer; forming a first via and a second via extending through the second insulating layer; and forming a second signal line layer comprising a plurality of columns of second signal lines on a side of the second insulating layer distal to the repair line; the plurality of rows of first signal lines crossing over the plurality of columns of second signal lines defining a plurality of subpixels.

Optionally, the method comprising sequentially forming a second signal line layer comprising a plurality of columns of second signal lines on a base substrate; forming a second insulating layer on the second signal line layer; forming a first via and a second via extending through the second insulating layer; forming a repair line on a side of the second insulating layer distal to the second signal line layer; forming a first insulating layer on a side of the repair line distal to the second insulating layer; and forming a first signal line layer comprising a plurality of rows of first signal lines on a side of the first insulating layer distal to the repair line; the plurality of rows of first signal lines crossing over the plurality of columns of second signal lines defining a plurality of subpixels.

Optionally, the first signal line layer is a gate line layer comprising a plurality of rows of gate lines; and the second signal line layer is a data line layer comprising a plurality of columns of data lines.

Optionally, the first signal line layer is a data line layer comprising a plurality of rows of data lines; and the second signal line layer is a gate line layer comprising a plurality of columns of gate lines.

In another aspect, the present disclosure provides an array substrate repaired by a method described herein.

In another aspect, the present disclosure provides a display panel comprising an array substrate described herein or fabricated by a method described herein or repaired by a method described herein.

In another aspect, the present disclosure provides display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
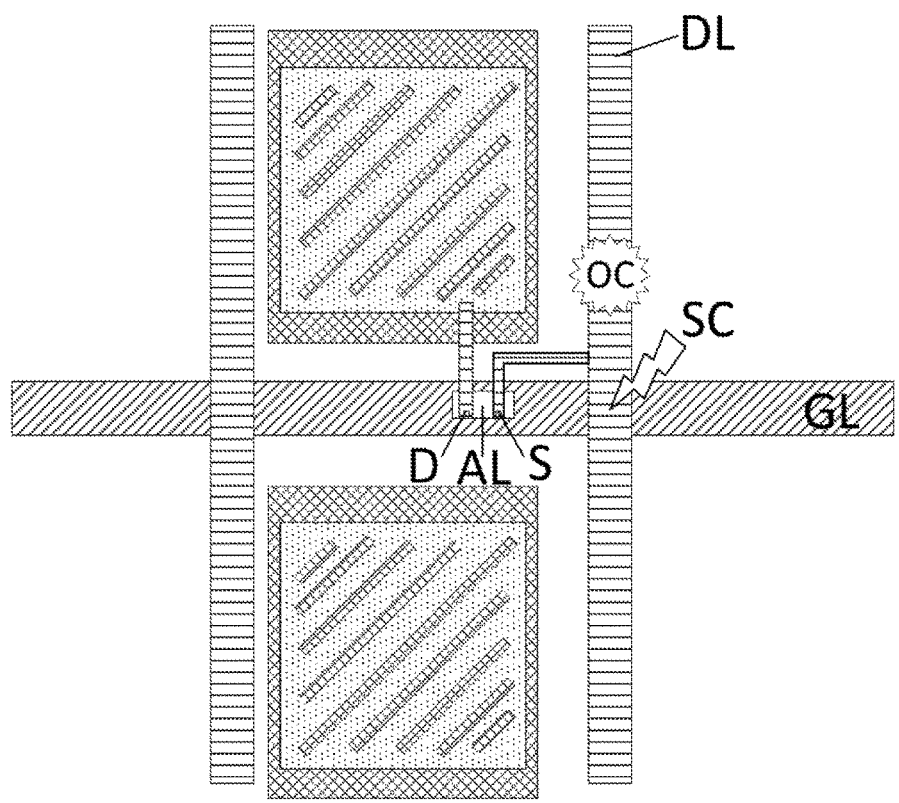
FIG. 1 is a diagram illustrating the structure of a conventional array substrate.

FIG. 1 is a diagram illustrating the structure of a conventional array substrate. Referring to FIG. 1, the conventional array substrate includes a gate line layer having a plurality of rows of gate lines GL and a data line layer having a plurality of columns of data lines DL; the plurality of rows of gate lines GL and the plurality of columns of data lines DL cross over each other defining a plurality of subpixels. As shown in FIG. 1, the conventional array substrate is prone to multiple defects including signal line open circuit OC (e.g., data line open circuit and gate line open circuit), and data-gate short circuit SC. These defects are extremely difficult to repair once the array substrate has been fabricated. For example, repair of a signal line open circuit OC typically involves chemical depositing metal at the open circuit portion of the signal line to reconnect the open signal line. The conventional repairing method are complicated and expensive, leading to higher manufacturing costs.

Accordingly, the present invention provides, inter alia, an array substrate, a display panel and a display apparatus having the same, a repairing method and a fabricating method thereof that substantially obviate one or more of the problems due to limitations and disadvantages of the related art. In one aspect, the present disclosure provides a novel array substrate having a first signal line layer including a plurality of rows of first signal lines; a second signal line layer including a plurality of columns of second signal lines; a first insulating layer and a second insulating layer between the first signal line layer and the second signal line layer; a repair line between the first insulating layer and the second insulating layer, the repair line corresponding to one of the plurality of columns of second signal lines; and a first via and a second via extending through the second insulating layer. The repair line is electrically connected to the corresponding one of the plurality of columns of second signal lines through the first via and the second via, respectively. The plurality of rows of first signal lines cross over the plurality of columns of second signal lines defining a plurality of subpixels. Optionally, the first insulating layer is on a side of the second insulating layer proximal to the first signal line layer.

The first signal line and the second signal line may be any appropriate signal lines in the array substrate that crossing over each other. Examples of appropriate signal lines include, but are not limited to, gate lines, data lines, common electrode signal lines, and touch signal lines. Optionally, the first signal line layer is a gate line layer having a plurality of rows of gate lines, and the second signal line layer is a data line layer having a plurality of columns of data lines. Optionally, the first signal line layer is a data line layer having a plurality of rows of data lines, and the second signal line layer is a gate line layer having a plurality of columns of gate lines. Optionally, the first signal line layer is a common electrode signal line layer having a plurality of rows of common electrode signal lines, and the second signal line layer is a data line layer having a plurality of columns of data lines. Optionally, the first signal line layer is a data line layer having a plurality of rows of data lines, and the second signal line layer is a common electrode signal line layer having a plurality of columns of common electrode signal lines. Optionally, the first signal line layer is on a side of the second signal line layer proximal to a base substrate. Optionally, the second signal line layer is on a side of the first signal line layer proximal to a base substrate.

In some embodiments, the repair line is a data line repair line. Optionally, the first signal line layer is a gate line layer including a plurality of rows of gate lines, and the second signal line layer is a data line layer including a plurality of columns of data lines. Optionally, the array substrate is an array substrate having a bottom gate type thin film transistor. Optionally, the array substrate includes a base substrate; a gate line layer including a plurality of rows of gate lines on the base substrate; a first insulating layer on a side of the gate line layer distal to the base substrate; a repair line on a side of the first insulating layer distal to the gate line layer; a second insulating layer on a side of the repair line distal to the first insulating layer; a first via and a second via extending through the second insulating layer; and a data line layer including a plurality of columns of data lines on a side of the second insulating layer distal to the repair line; the plurality of rows of gate lines crossing over the plurality of columns of data lines defining a plurality of subpixels. The data line repair line is electrically connected to the corresponding one of the plurality of columns of data lines through the first via and the second via, respectively.

In some embodiments, the repair line is a data line repair line. Optionally, the first signal line layer is a gate line layer including a plurality of rows of gate lines, and the second signal line layer is a data line layer including a plurality of columns of data lines. Optionally, the array substrate is an array substrate having a top gate type thin film transistor. Optionally, the array substrate includes a base substrate; a data line layer having a plurality of columns of data lines on a base substrate; a second insulating layer on a side of the data line layer distal to the base substrate; a first via and a second via extending through the second insulating layer; a repair line on a side of the second insulating layer distal to the data line layer; a first insulating layer on a side of the repair line distal to the second insulating layer; and a gate line layer including a plurality of rows of gate lines on a side of the first insulating layer distal to the repair line; the plurality of rows of gate lines crossing over the plurality of columns of data lines defining a plurality of subpixels. The data line repair line is electrically connected to the corresponding one of the plurality of columns of data lines through the first via and the second via, respectively.

In some embodiments, the repair line is a gate line repair line. Optionally, the first signal line layer is a data line layer including a plurality of rows of data lines, and the second signal line layer is a gate line layer including a plurality of columns of gate lines. Optionally, the array substrate is an array substrate having a bottom gate type thin film transistor. Optionally, the array substrate includes a base substrate; a gate line layer including a plurality of columns of gate lines on the base substrate; a second insulating layer on a side of the gate line layer distal to the base substrate; a first via and a second via extending through the second insulating layer; a repair line on a side of the second insulating layer distal to the gate line layer; a first insulating layer on a side of the repair line distal to the second insulating layer; and a data line layer including a plurality of rows of data lines on a side of the first insulating layer distal to the repair line; the plurality of columns of gate lines crossing over the plurality of rows of data lines defining a plurality of subpixels. The gate line repair line is electrically connected to the corresponding one of the plurality of columns of gate lines through the first via and the second via, respectively.

In some embodiments, the repair line is a gate line repair line. Optionally, the first signal line layer is a data line layer including a plurality of rows of data lines, and the second signal line layer is a gate line layer including a plurality of columns of gate lines. Optionally, the array substrate is an array substrate having a top gate type thin film transistor. Optionally, the array substrate includes a base substrate; a data line layer having a plurality of rows of data lines on a base substrate; a first insulating layer on a side of the data line layer distal to the base substrate; a repair line on a side of the first insulating layer distal to the data line layer; a second insulating layer on a side of the repair line distal to the first insulating layer; a first via and a second via extending through the second insulating layer; and a gate line layer including a plurality of columns of gate lines on a side of the second insulating layer distal to the repair line; the plurality of columns of gate lines crossing over the plurality of rows of data lines defining a plurality of subpixels. The gate line repair line is electrically connected to the corresponding one of the plurality of columns of gate lines through the first via and the second via, respectively.

The array substrate may include a plurality of the repairs lines between the first insulating layer and the second insulating layer. For example, the array substrate may include one repair line per subpixel. Optionally, the array substrate includes one repair line per pixel, each pixel includes a plurality of subpixels. Optionally, the array substrate includes one repair line per multiple subpixels, e.g., one repair line per 2, 3, 4, 6, 8, or more subpixels. Optionally, the array substrate includes one repair line per multiple pixels, e.g., one repair line per 2, 4, 8, 10, or more pixels.

Accordingly, the array substrate includes a plurality of first vias and second vias corresponding to the plurality of the repair lines. Each of the plurality of first vias extends through the second insulating layer; and each of the plurality of second vias extends through the second insulating layer. Each of the plurality of the repair lines is electrically connected to a second signal line through a corresponding pair of first via and second via, respectively.

In some embodiments, the repair line is in an inter-subpixel area. Optionally, the repair line may be partially in the subpixel area. As used herein, a subpixel region refers to a light emission region of a subpixel, such as a region corresponding to a pixel electrode in a liquid crystal display, or a region corresponding to a light emissive layer in an organic light emitting display. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 2:
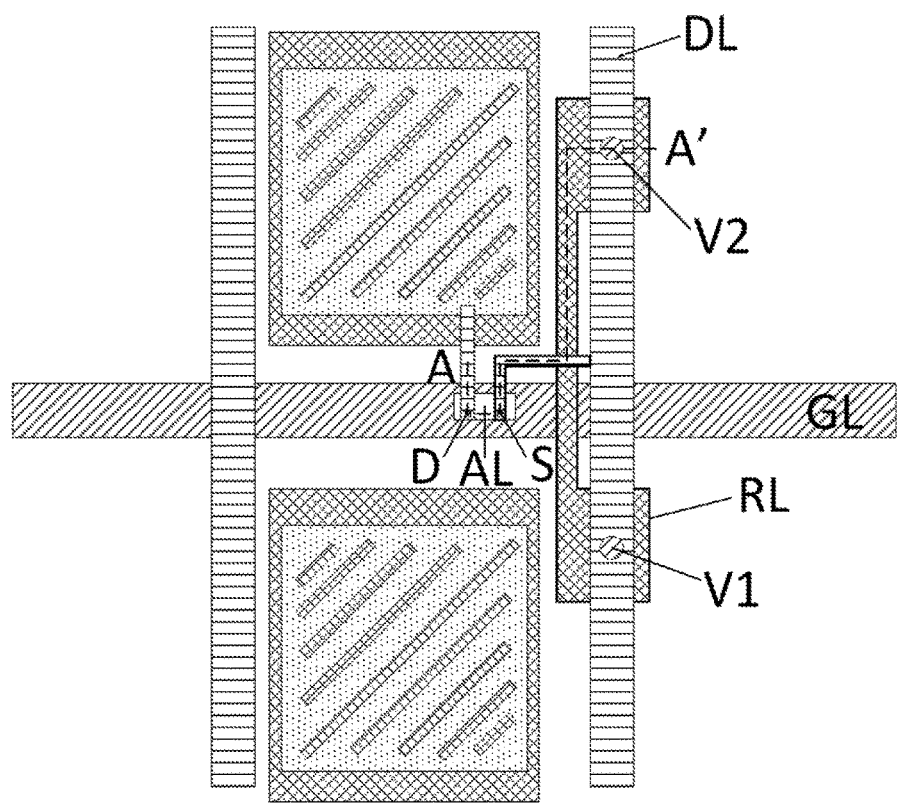
FIG. 2 is a diagram illustrating the structure of an array substrate in some embodiments according to the present disclosure.

FIG. 2 is a diagram illustrating the structure of an array substrate in some embodiments according to the present disclosure. Referring to FIG. 2, the array substrate in the embodiment includes a gate line layer having a plurality of rows of gate lines GL and a data line layer having a plurality of columns of data lines DL, the plurality of rows of gate lines GL and a plurality of columns of data lines DL crossing over each other defining a plurality of subpixels. Each subpixel includes a thin film transistor having an active layer AL, the thin film transistor is electrically connected to a source electrode S and a drain electrode D. The source electrode S is electrically connected to a data line DL. The array substrate in FIG. 2 further includes a repair line RL electrically connected to the data line DL through a first via V1 and a second via V2.

Figure 3:
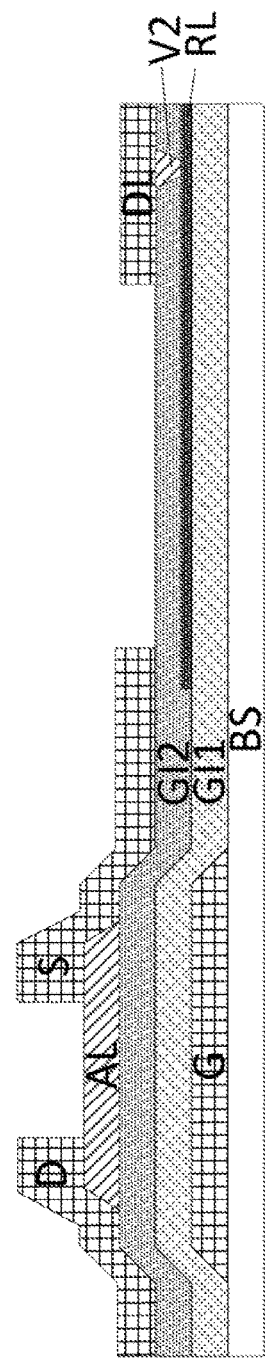
FIG. 3 is a cross-sectional view along the A-A' direction of the array substrate in FIG. 2.

FIG. 3 is a cross-sectional view along the A-A' direction of the array substrate in FIG. 2. Referring to FIG. 3, the array substrate includes a thin film transistor having a gate electrode G on a base substrate BS, a first insulating layer GI1 on a side of the gate electrode G distal to the base substrate BS, a second insulating layer GI2 on a side of the first insulating layer GI1 distal to the gate electrode G, an active layer AL on a side of the second insulating layer GI2 distal to the first insulating layer GI1, and a source electrode S and a drain electrode D on a side of the active layer AL distal to the second insulating layer GI2. The thin film transistor in the embodiment is a bottom gate type thin film transistor. The array substrate further includes a repair line RL between the first insulating layer GI1 and the second insulating layer GI2. Specifically, the array substrate includes a gate line layer (including the gate electrode G in FIG. 3) on the base substrate BS, a first insulating layer GI1 on a side of the gate line layer distal to the base substrate BS, a repair line RL on a side of the first insulating layer GI1 distal to the gate line layer, a second insulating layer GI2 on a side of the repair line RL distal to the first insulating layer GI1, a first via (not shown in FIG. 3) and a second via V2 extending through the second insulating layer GI2, and a data line layer DL on a side the second insulating layer GI2 distal to the repair line RL. The repair line RL is electrically connected to the data line DL through the first via and the second via V2, respectively.

Figure 4:
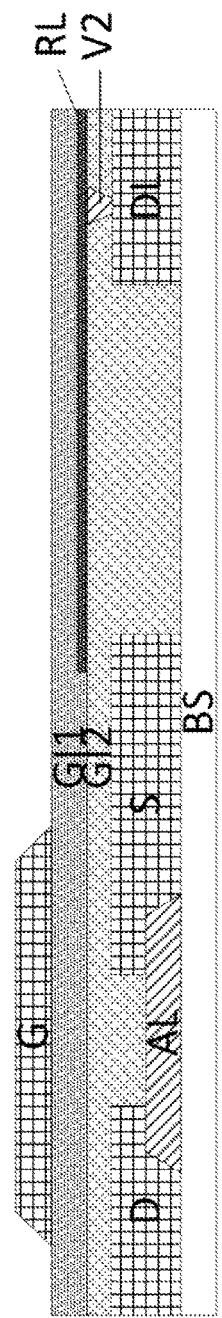
FIG. 4 is a cross-sectional view of an array substrate having a top gate type thin film transistor in some embodiments according to the present disclosure.

FIG. 4 is a cross-sectional view of an array substrate having a top gate type thin film transistor in some embodiments according to the present disclosure. Referring to FIG. 4, the array substrate includes a thin film transistor having an active layer AL on a base substrate BS, a source electrode S and a drain electrode D on a side of the active layer AL distal to the base substrate BS, a second insulating layer GI2 on a side of the source electrode S and drain electrode D distal to the base substrate BS, a first insulating layer GI1 on a side of the second insulating layer GI2 distal to the drain electrode D and source electrode S, and a gate electrode G on a side of the first insulating layer GI1 distal to the second insulating layer GI2. The thin film transistor in the embodiment is a top gate type thin film transistor. The array substrate further includes a repair line RL between the first insulating layer GI1 and the second insulating layer GI2. Specifically, the array substrate includes a data line layer DL on the base substrate BS, a second insulating layer GI2 on a side of the data line layer DL distal to the base substrate BS, a first via (not shown in FIG. 4) and a second via V2 extending through the second insulating layer GI2, a repair line RL on a side of the second insulating layer GI2 distal to the data line layer DL, a first insulating layer GI1 on a side of the repair line RL, distal to the second insulating layer GI2, and a gate line layer (including the gate electrode G in FIG. 4) on a side of the first insulating layer GI1 distal to the repair line RL. The repair line RL is electrically connected to the data line DL through the first via and the second via V2, respectively.

Figure 5:
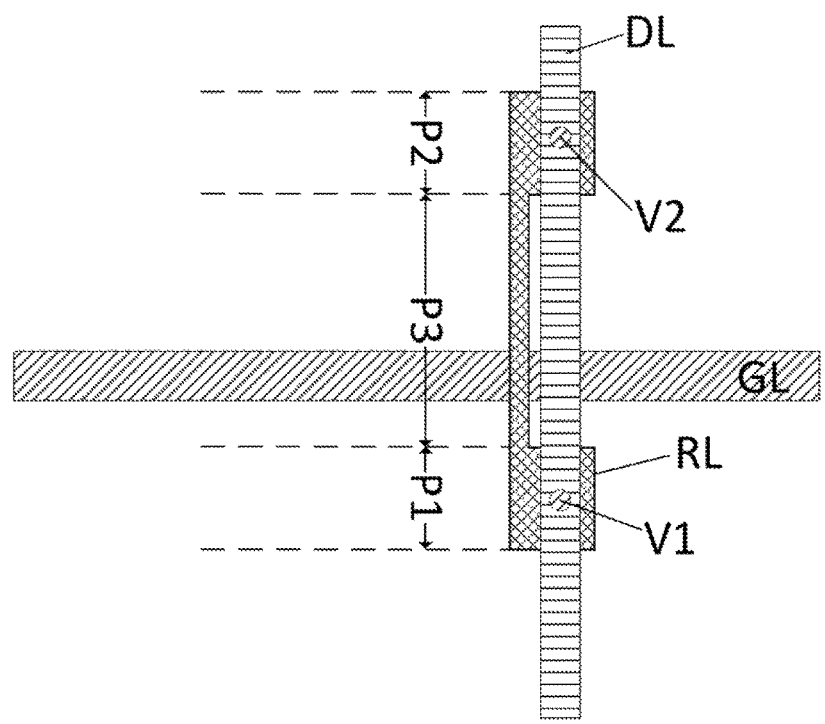
FIG. 5 is a diagram illustrating the structure of a repair line in some embodiments according to the present disclosure.

The repair line may be made of various appropriate shapes and dimensions. For example, the repair line may substantially overlap with the corresponding data line. The aperture ratio of an array substrate having such a repair line remains substantially the same as that of an array substrate not having a repair line, e.g., a conventional array substrate. Optionally, the repair line may partially overlap with the corresponding data line. FIG. 5 is a diagram illustrating the structure of a repair line in some embodiments according to the present disclosure. Referring to FIG. 5, overall the repair line RL is substantially parallel to the corresponding data line DL. The repair line RL crosses over the gate line GL. As shown in FIG. 5, projections of the first via V1 and the second via V2 on the array substrate are on two sides of the gate line GL crossing over the repair line RL.

Referring to FIG. 5, the repair line RL in the embodiment includes a first portion P1, a second portion P2, and a third portion P3. A projection of the first via V1 on the array substrate substantially overlaps with those of the first portion P1 and the corresponding data line DL. A projection of the second via V2 on the array substrate substantially overlaps with those of the second portion P2 and the corresponding data line DL. A projection of the third portion P3 on the array substrate is spaced apart from that of the corresponding data line DL. Optionally, the projection of the third portion P3 on the array substrate partially overlaps with that of the corresponding data line DL. By having this design, the corresponding data line DL may be cut without inadvertently cutting the underlying repair line RL.

Figure 6:
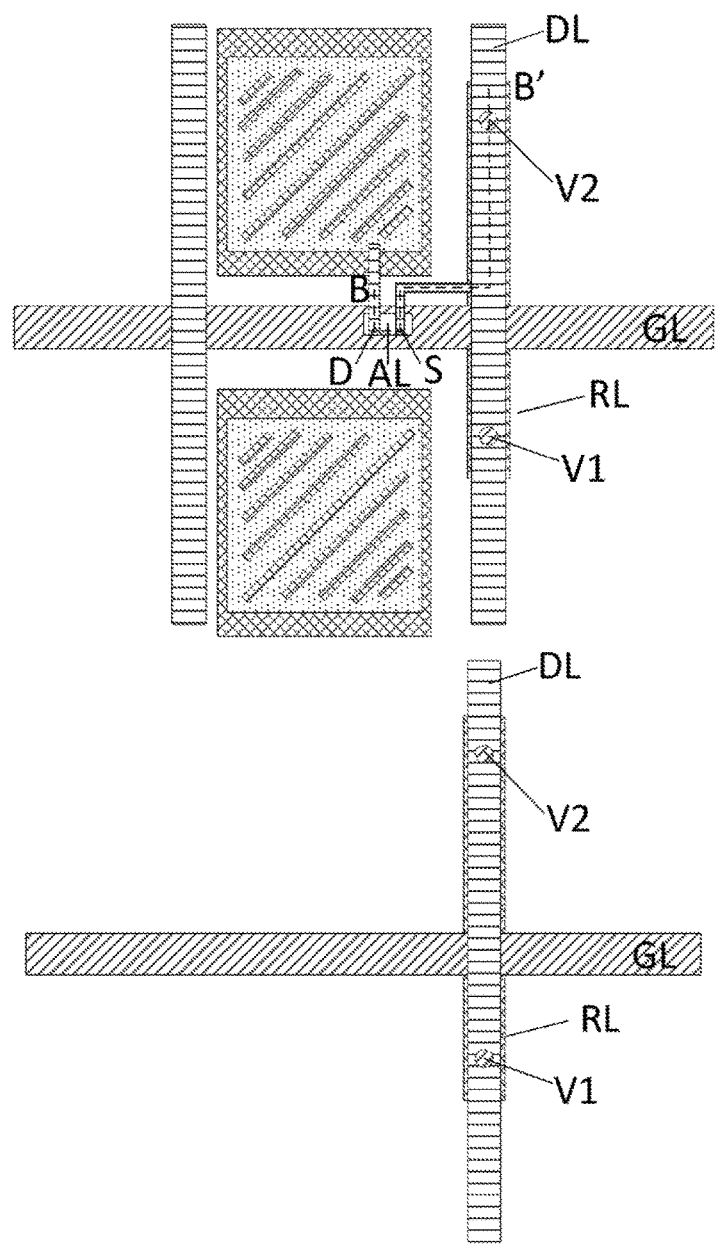
FIG. 6 is a diagram illustrating the structure of an array substrate in some embodiments according to the present disclosure.

The repair line may be other configurations. FIG. 6 is a diagram illustrating the structure of an array substrate in some embodiments according to the present disclosure. Referring to FIG. 6, the repair line RL is substantially parallel to the corresponding data line DL, and crosses over the gate line GL. Projections of the first via V1 and the second via V2 on the array substrate are on two sides of the gate line GL crossing over the repair line RL. As shown in FIG. 6, a projection of the repair line RL in the embodiment substantially overlaps with that of the corresponding data line DL. By having this design, the aperture ratio of the array substrate will not be decreased by the addition of the repair line.

Various appropriate conductive materials and various appropriate fabricating methods may be used for making the repair line. For example, a conductive material may be deposited on the substrate (e.g., by sputtering, vapor deposition, solution coating, or spin coating); and patterned (e.g., by lithography such as a wet etching process) to form the repair line. Examples of appropriate conductive materials for making the repair line include, but are not limited to, various metal materials such as nano-silver, molybdenum, aluminum, silver, chromium, tungsten, titanium, tantalum, copper, and alloys or laminates containing the same; and various conductive metal oxides such as indium tin oxide.

Figure 7:
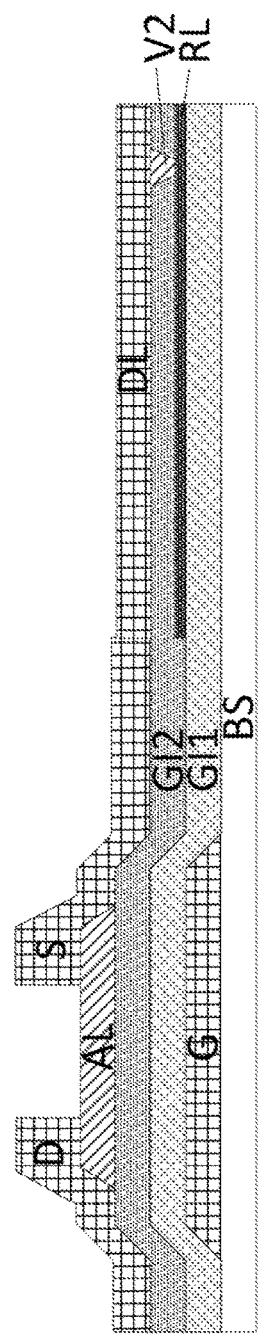
FIG. 7 is a cross-sectional view along the B-B' direction of the array substrate in FIG. 6.

FIG. 7 is a cross-sectional view along the B-B' direction of the array substrate in FIG. 6. Referring to FIG. 7, the array substrate includes a thin film transistor having a gate electrode G on a base substrate BS, a first insulating layer GI1 on a side of the gate electrode G distal to the base substrate BS, a second insulating layer GI2 on a side of the first gate insulating layer GI1 distal to the gate electrode G, an active layer AL on a side of the second insulating layer GI2 distal to the first insulating layer GI1, and a source electrode S and a drain electrode D on a side of the active layer AL distal to the second insulating layer GI2. The thin film transistor in the embodiment is a bottom gate type thin film transistor. The array substrate further includes a repair line RL between the first insulating layer GI1 and the second insulating layer GI2. A projection of the repair line RL in the embodiment substantially overlaps with that of the corresponding data line DL. Specifically, the array substrate includes a gate line layer (including the gate electrode G in FIG. 7) on the base substrate BS, a first insulating layer GI1 on a side of the gate line layer distal to the base substrate BS, a repair line RL on a side of the first insulating layer GI1 distal to the gate line layer, a second insulating layer GI2 on a side of the repair line RL distal to the first insulating layer GI1, a first via (not shown FIG. 7) and a second via V2 extending through the second insulating layer GI2, and a data line layer DL on a side the second insulating layer GI2 distal to the repair line RL. The repair line RL is electrically connected to the data line DL through the first via and the second via V2, respectively, and a projection of the repair line RL substantially overlaps with that of the corresponding data line DL.

Figure 8:
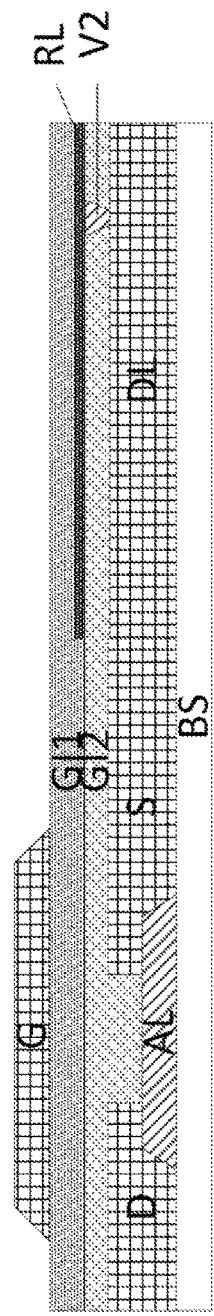
FIG. 8 is a cross-sectional view of an array substrate having a top gate type thin film transistor in some embodiments according to the present disclosure.

FIG. 8 is a cross-sectional view of an array substrate having a top gate type thin film transistor in some embodiments according to the present disclosure. Referring to FIG. 8, the array substrate includes a thin film transistor having an active layer AL on a base substrate BS, a source electrode S and a drain electrode D on a side of the active layer AL distal to the base substrate a second insulating layer GI2 on a side of the source electrode S and drain electrode D distal to the base substrate BS, a first insulating layer GI1 on a side of the second insulating layer GI2 distal to the drain electrode D and source electrode S, and a gate electrode G on a side of the first insulating layer GI1 distal to the second insulating layer GI2. The thin film transistor in the embodiment is a top gate type thin film transistor. The array substrate further includes a repair line RL between the first insulating layer GI1 and the second insulating layer GI2. Specifically, the array substrate includes a data line layer DL on the base substrate BS, a second insulating layer GI2 on a side of the data line layer DL distal to the base substrate BS, a first via (not shown in FIG. 8) and a second via V2 extending through the second insulating layer GI2, a repair line RL on a side of the second insulating layer GI2 distal to the data line layer DL, a first insulating layer GI1 on a side of the repair line RL distal to the second insulating layer GI2, and a gate line layer (including the gate electrode G in FIG. 8) on a side of the first insulating layer GI1 distal to the repair line RL. The repair line RL is electrically connected to the data line DL through the first via and the second via V2, respectively, and a projection of the repair line RL substantially overlaps with that of the corresponding data line DL.

In some embodiments, the array substrate includes a gate line layer having a plurality of first rows of gate lines, a common electrode signal line layer having a plurality of second rows of common electrode signal lines, and a data line layer having a plurality of columns of data lines. Optionally, the gate line layer and the common electrode signal line layer are in a same layer. Optionally, the plurality of first rows of gate lines and the plurality of second rows of common electrode signal lines are substantially parallel to each other. The plurality of first rows of gate lines and the plurality of columns of data lines cross over each other defining a plurality of subpixels. Moreover, the plurality of second rows of common electrode signal lines and the plurality of columns of data lines cross over each other. Optionally, the plurality of first rows of gate lines and the plurality of second rows of common electrode signal lines are disposed in the inter-subpixel areas of the array substrate. The array substrate further includes a first insulating layer and a second insulating layer between the data line layer and the same layer having the gate line layer and the common electrode signal line layer, the first insulating layer on a side of the data line layer proximal to the same layer having the gate line layer and the common electrode signal line layer. The array substrate further includes a repair line between the first insulating layer and the second insulating layer, the repair line corresponding to one of the plurality of columns of data lines; and a first via and a second via extending through the second insulating layer. The repair line is electrically connected to the corresponding one of the plurality of columns of data lines through the first via and the second via, respectively. Optionally, the repair line crosses over one of the plurality of first rows of gate lines and one of the plurality of second rows of common electrode signal lines. Projections on the array substrate of the one of the plurality of first rows of gate lines crossing over the repair line and the one of the plurality of second rows of common electrode signal lines crossing over the repair line are both between those of the first via and the second via. Optionally, the repair line includes a first portion, a second portion, and a third portion as described above. Optionally, projections of the first cutting position and the second cutting position on the array substrate overlap with that of the third portion, respectively.

In another aspect, the present disclosure provides a method of repairing a signal line short circuit in an array substrate described herein. In some embodiments, the array substrate includes a first signal line layer including a plurality of rows of first signal lines; a second signal line layer including a plurality of columns of second signal lines; a first insulating layer and a second insulating layer between the first signal line layer and the second signal line layer; a repair line between the first insulating layer and the second insulating layer, the repair line corresponding to one of the plurality of columns of second signal lines; and a first via and a second via extending through the second insulating layer. The repair line is electrically connected to the corresponding one of the plurality of columns of second sigma lines through the first via and the second via, respectively. The plurality of rows of first signal lines cross over the plurality of columns of second signal lines defining a plurality of subpixels. Optionally, the first insulating layer is on a side of the second insulating layer proximal to the first signal line layer. Optionally, the repair line crosses over one of the plurality of rows of first signal lines; and projections of the first via and the second via on the array substrate are on two sides of that of the one of the plurality of rows of first signal lines crossing over the repair line.

In some embodiments, the method is a method of repairing a signal line short circuit between the corresponding one of the plurality of columns of second signal lines and the one of the plurality of rows of first signal lines crossing over the repair line in the array substrate. The method includes electrically disconnecting the corresponding one of the plurality of columns of second signal lines from the one of the plurality of rows of first signal lines crossing over the repair line. Various appropriate methods may be used for electrically disconnecting the corresponding one of the plurality of columns of second signal lines from the one of the plurality of rows of first signal lines crossing over the repair line. Optionally, the signal line short circuit is a data-gate short circuit between a data line and a gate line crossing over each other. Optionally, the signal line short circuit may be a short circuit between two different signal lines selected from a gate line, a data line, a common electrode signal line, and a touch signal line.

Figure 9:
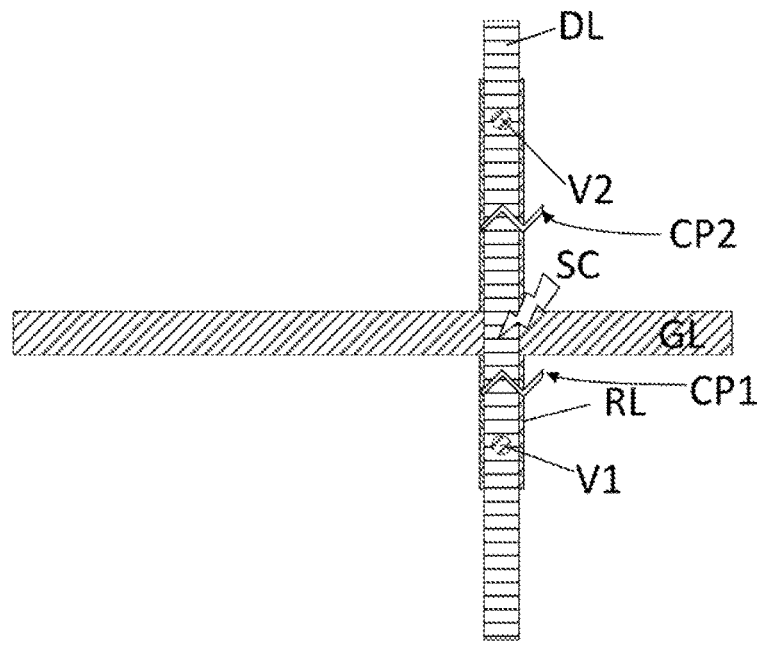
FIG. 9 is a diagram illustrating a method of repairing data-gate short in an array substrate in some embodiments according to the present disclosure.

FIG. 9 is a diagram illustrating a method of repairing data-gate short in an array substrate in some embodiments according to the present disclosure. Referring to FIG. 9, the gate line GL and the data line DL cross over each other forming an intersection, and the repair line RL crosses over the gate line GL. At the intersection, a data-gate short circuit SC occurs. In this embodiment, the repair line RL, substantially overlaps with the data line DL. In some embodiments, the step of electrically disconnecting the data line and the gate line involved in the short circuit includes cutting the data line DL at a first cutting position CP1 and a second cutting position CP2. As shown in FIG. 9, a projection of the first cutting position CP1 on the array substrate is between those of the first via V1 and the gate line GL (which crosses over the repair line RL). A projection of the second cutting position CP2 on the array substrate is between those of the second via V2 and the gate line GL. After the data line DL is cut at the first cutting position CP1 and the second cutting position CP2, the data-gate short circuit issue is resolved because the short circuit portion is not electrically connected to the data line DL any longer. The data line DL can still function normally because the repair line electrically connects other portions of the data line DL through the first via V1 and the second via V2, bypassing the data signal from the short circuit portion.

Figure 10:
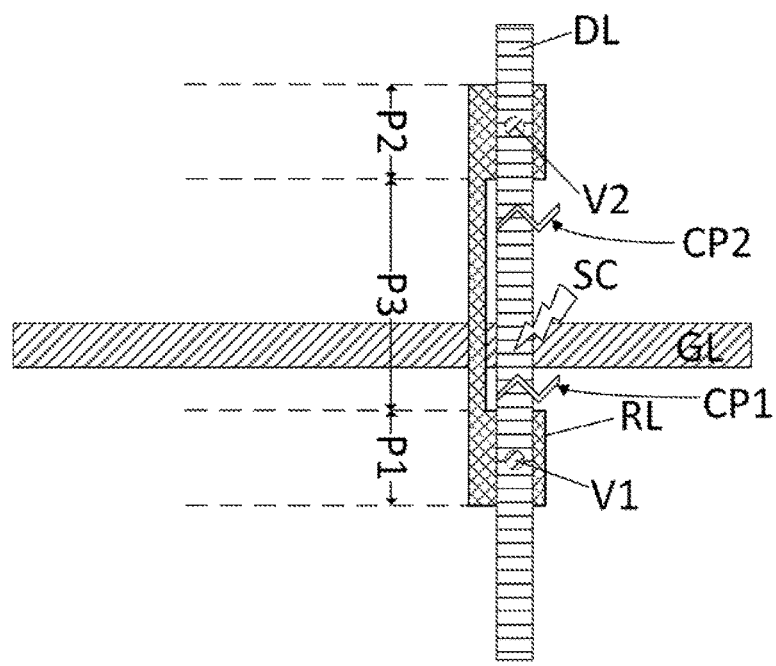
FIG. 10 is a diagram illustrating a method of repairing data-gate short in an array substrate in some embodiments according to the present disclosure.

FIG. 10 is a diagram illustrating a method of repairing data-gate short in an array substrate in some embodiments according to the present disclosure. Referring to FIG. 10, the gate line GL and the data line DL cross over each other forming an intersection, and the repair line RL crosses over the gate line GL. At the intersection, a data-gate short circuit SC occurs. In this embodiment, the repair line RL includes a first portion P1, a second portion P2, and a third portion P3. Projections of the first via V1 and the second via V2 on the array substrate are on two sides of that of the gate line GL (which crosses over the repair line RL). A projection of the first via V1 on the array substrate substantially overlaps with those of the first portion P1 and the data line DL. A projection of the second via V2 on the array substrate substantially overlaps with those of the second portion P2 and the data line DL. In some embodiments, the step of electrically disconnecting the data line and the gate line involved in the short circuit includes cutting the data line DL at a first cutting position CP1 and a second cutting position CP2. A projection of the third portion P3 on the array substrate is spaced apart from that of the data line DL. As shown in FIG. 10, projections of the first cutting position CP1 and the second cutting position CP2 on the array substrate overlap with that of the third portion P3, respectively. After the data line DL is cut at the first cutting position CP1 and the second cutting position CP2, the data-gate short circuit issue is resolved because the short circuit portion is not electrically connected to the data line DL any longer. The data line DL can still function normally because the repair line electrically connects other portions of the data line DL through the first via V1 and the second via V2, bypassing the data signal from the short circuit portion. Because the third portion P3 of the repair line RL is spaced apart from the data line, the repair line RL will not be inadvertently cut when cutting the data line at the first cutting position CP1 and the second cutting position CP2.

In some embodiments, the array substrate includes a gate line layer having a plurality of first rows of gate lines, a common electrode signal line layer having a plurality of second rows of common electrode signal lines, and a data line layer having a plurality of columns of data lines. Optionally, the gate line layer and the common electrode signal line layer are in a same layer. Optionally, the plurality of first rows of gate lines and the plurality of second rows of common electrode signal lines are substantially parallel to each other. The plurality of first rows of gate lines and the plurality of columns of data lines cross over each other defining a plurality of subpixels. Moreover, the plurality of second rows of common electrode signal lines and the plurality of columns of data lines cross over each other. Optionally, the plurality of first rows of gate lines and the plurality of second rows of common electrode signal lines are disposed in the inter-subpixel areas of the array substrate. The array substrate further includes a first insulating layer and a second insulating layer between the data line layer and the same layer having the gate line layer and the common electrode signal line layer, the first insulating layer on a side of the data line layer proximal to the same layer having the gate line layer and the common electrode signal line layer. The array substrate further includes a repair line between the first insulating layer and the second insulating layer, the repair line corresponding to one of the plurality of columns of data lines; and a first via and a second via extending through the second insulating layer. The repair line is electrically connected to the corresponding one of the plurality of columns of data lines through the first via and the second via, respectively. Optionally, the repair line and the one of the plurality of columns of data lines cross over one of the plurality of first rows of gate lines and one of the plurality of second rows of common electrode signal lines. Projections on the array substrate of the one of the plurality of first rows of gate lines crossing over the repair line and the one of the plurality of second rows of common electrode signal lines crossing over the repair line are both between those of the first via and the second via. In some embodiments, the method of repairing a signal line short circuit in such an array substrate includes cutting the data line corresponding to the repair line at a first cutting position and a second cutting position. A projection of the first cutting position on the array substrate is between those of the first via and the one of the plurality of second rows of common electrode signal lines crossing over the repair line. A projection of the second cutting position on the array substrate is between those of the second via and the one of the plurality of first rows of gate lines crossing over the repair line. Optionally, the repair line includes a first portion, a second portion, and a third portion as described above. Optionally, projections of the first cutting position and the second cutting position on the array substrate overlap with that of the third portion, respectively.

In another aspect, the present disclosure provides a method of fabricating an array substrate. In some embodiments, the method includes for a first signal line layer having a plurality of rows of first signal lines; and a second signal line layer having a plurality of columns of second signal lines; the plurality of rows of first signal lines crossing over the plurality of columns of second signal lines defining a plurality of subpixels; forming a first insulating layer and a second insulating layer between the first signal line layer and the second signal line layer; the first insulating layer on a side of the second insulating layer proximal to the first signal line layer; forming a repair line between the first insulating layer and the second insulating layer, the repair line corresponding to one of the plurality of columns of second signal lines; and forming a first via and a second via extending through the second insulating layer. The repair line is formed to be electrically connected to the corresponding one of the plurality of columns of second signal lines through the first via and the second via, respectively.

The first signal line and the second signal line may be any appropriate signal lines in the array substrate that crossing over each other. Examples of appropriate signal lines include, but are not limited to, gate lines, data lines, common electrode signal lines, and touch signal lines. Optionally, the first signal line layer is a gate line layer having a plurality of rows of gate lines, and the second signal line layer is a data line layer having a plurality of columns of data lines. Optionally, the first signal line layer is a data line layer having a plurality of rows of data lines, and the second signal line layer is a gate line layer having a plurality of columns of gate lines. Optionally, the first signal line layer is a common electrode signal line layer having a plurality of rows of common electrode signal lines, and the second signal line layer is a data line layer having a plurality of columns of data lines. Optionally, the first signal line layer is a data line layer having a plurality of rows of data lines, and the second signal line layer is a common electrode signal line layer having a plurality of columns of common electrode signal lines. Optionally, the first signal line layer is on a side of the second signal line layer proximal to a base substrate. Optionally, the second signal line layer is on a side of the first signal line layer proximal to a base substrate.

In some embodiments, the method includes forming a first signal line layer having a plurality of rows of first signal lines on a base substrate; forming a first insulating layer on a side of the first signal line layer distal to the base substrate; forming a repair line on a side of the first insulating layer distal to the first signal line layer; forming a second insulating layer on a side of the repair line distal to the first insulating layer; forming a first via and a second via extending through the second insulating layer; and forming a second signal line layer having a plurality of columns of second signal lines on a side of the second insulating layer distal to the repair line; the plurality of rows of first signal lines crossing over the plurality of columns of second signal lines defining a plurality of subpixels. Optionally, the first signal line layer is a gate line layer, and the second signal line layer is a data line layer. Optionally, the first signal line layer is a data line layer, and the second signal line layer is a gate line layer.

In some embodiments, the method includes forming a second signal line layer having a plurality of columns of second signal lines on a base substrate; forming a second insulating layer on the second signal line layer; forming a first via and a second via extending through the second insulating layer; forming a repair line on a side of the second insulating layer distal to the second signal line layer; forming a first insulating layer on a side of the repair line distal to the second insulating layer; and forming a first signal line layer having a plurality of rows of first signal lines on a side of the first insulating layer distal to the repair line; the plurality of rows of first signal lines crossing over the plurality of columns of second signal lines defining a plurality of subpixels. Optionally, the first signal line layer is a gate line layer, and the second signal line layer is a data line layer. Optionally, the first signal line layer is a data line layer, and the second signal line layer is a gate line layer.

Figure 11A:
FIGS. 11A to 11E illustrate a process of fabricating an array substrate in some embodiments according to the present disclosure.
Figure 11B:
Figure 11C:
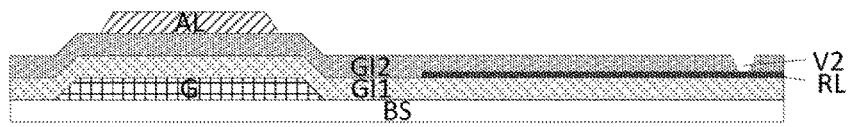
Figure 11D:
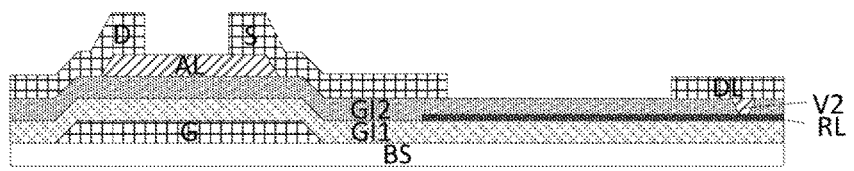
Figure 11E:
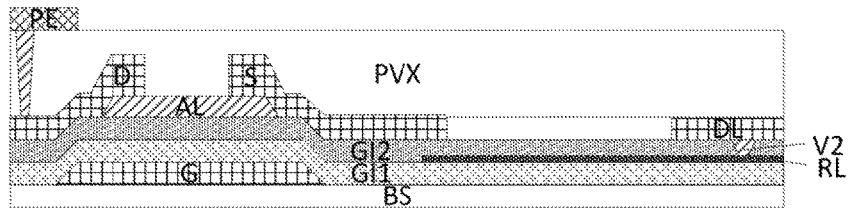
Figure 12A:
FIGS. 12A to 12E illustrate a process of fabricating an array substrate in some embodiments according to the present disclosure.
Figure 12B:
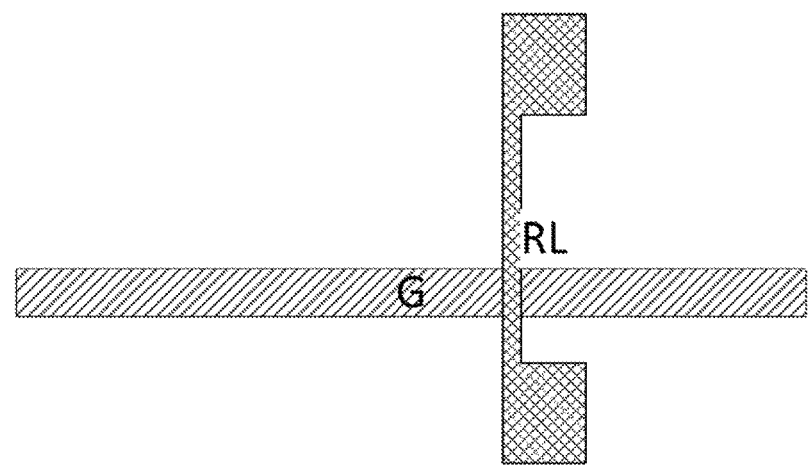
Figure 12C:
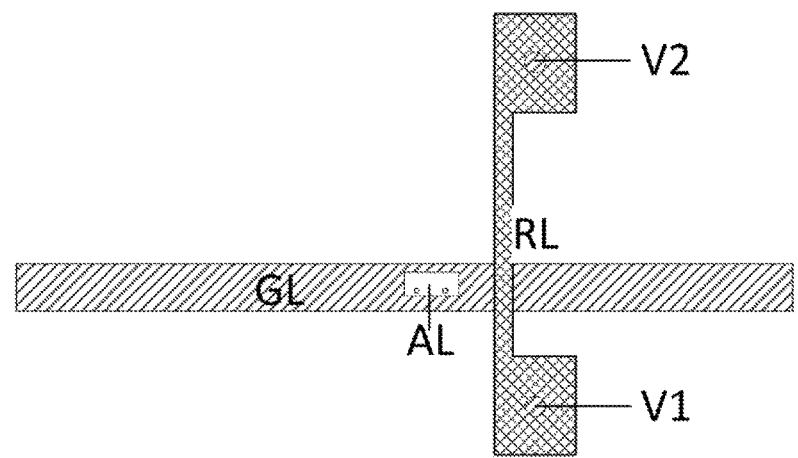
Figure 12D:
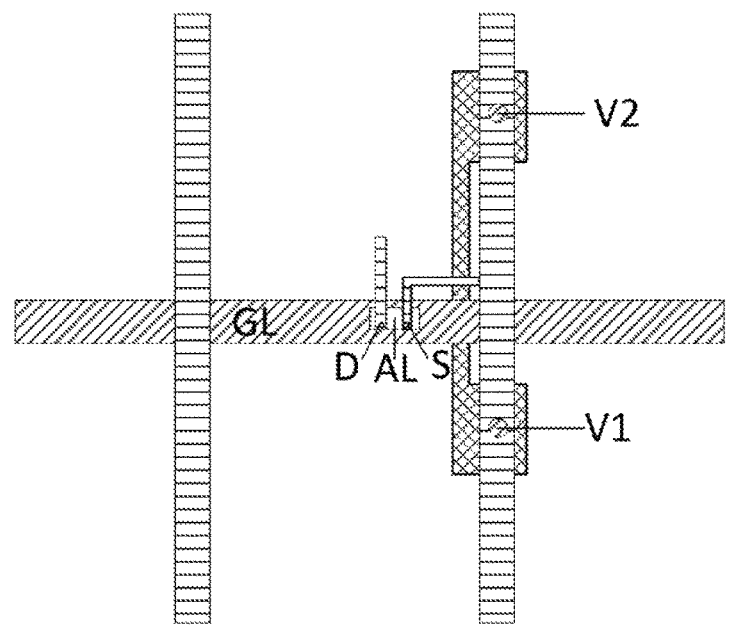
Figure 12E:
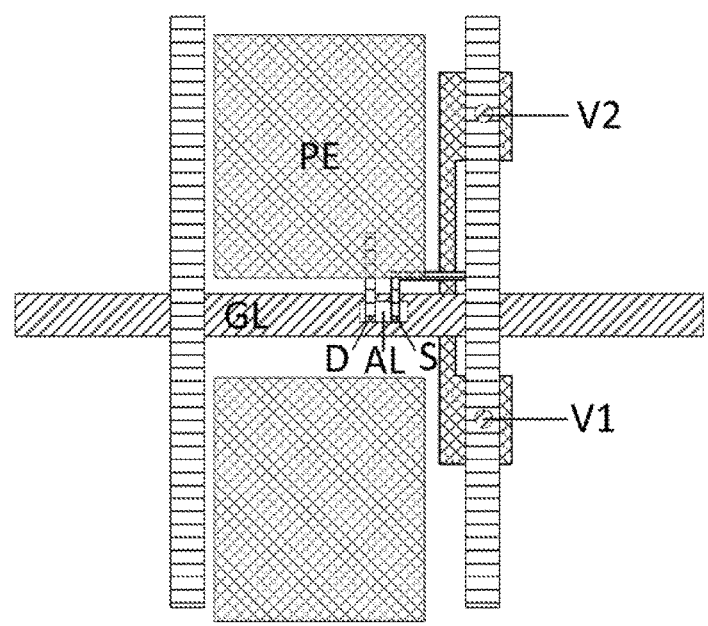

FIGS. 11A to 11E illustrate a process of fabricating an array substrate in some embodiments according to the present disclosure. FIGS. 12A to 12E illustrate a process of fabricating an array substrate in some embodiments according to the present disclosure. Referring to FIG. 11A and FIG. 12A, the method in the embodiment includes forming a gate line layer GL (including the gate electrode G) on a base substrate BS, and subsequently forming a first insulating layer GI1 on a side of the gate line layer GL (including the gate electrode G) distal to the base substrate BS. The method further includes forming a repair line RL on a side of the first insulating layer GI1 distal to the gate line layer GL (FIG. 11B, FIG. 12B), and subsequently forming a second insulating layer GI2 on a side of the repair line RL distal to the first insulating layer GI1. The repair line RL is formed to cross over the gate line GL. The method then includes forming an active layer AL on a side of the second insulating layer GI2 distal to the first insulating layer GI1, and forming a first via V1 and a second via V2 extending through the second insulating layer GI2. Projections of the first via V1 and the second via V2 on the array substrate are on two sides of the projection of gate line GL. The first via V1 and the second via V2 expose the repair line RL. Referring to FIG. 11D and FIG. 12D, the method further includes forming a drain electrode D and a source electrode S on a side of the active layer AL distal to the second insulating layer GI2, and forming the data line layer DL on a side of the second insulating layer GI2 distal to the repair line RL. Optionally, the drain electrode, the source electrode, and the date line layer are formed in a same process, e.g., using a same mask plate. The data line layer DL is electrically connected to the repair line RL through the first via V1 and the second via V2. The data line DL corresponding to the repair line RL crosses over the gate line GL. The source electrode S is electrically connected to the data line DL. In FIG. 11E and FIG. 12E, a passivation layer PVX is formed on the data line layer DL, the drain electrode D, and the source electrode S. The method further includes forming a pixel electrode layer PE on a side of the passivation layer PVX distal to the base substrate BS.

In some embodiments, the repair line is a data line repair line. Optionally, the first signal line layer is a gate line layer including a plurality of rows of gate lines, and the second signal line layer is a data line layer including a plurality of columns of data lines. Optionally, the array substrate is an array substrate having a bottom gate type thin film transistor. Optionally, the method includes forming a gate line layer including a plurality of rows of gate lines on a base substrate; forming a first insulating layer on a side of the gate line layer distal to the base substrate; forming a repair line on a side of the first insulating layer distal to the gate line layer; forming a second insulating layer on a side of the repair line distal to the first insulating layer; forming a first via and a second via extending through the second insulating layer; and forming a data line layer including a plurality of columns of data lines on a side of the second insulating layer distal to the repair line. The plurality of rows of gate lines are formed to cross over the plurality of columns of data lines thereby defining a plurality of subpixels. The data line repair line is formed to be electrically connected to the corresponding one of the plurality of columns of data lines through the first via and the second via, respectively.

In some embodiments, the repair line is a data line repair line. Optionally, the first signal line layer is a gate line layer including a plurality of rows of gate lines, and the second signal line layer is a data line layer including a plurality of columns of data lines. Optionally, the array substrate is an array substrate having a top gate type thin film transistor. Optionally, the method includes forming a data line layer having a plurality of columns of data lines on a base substrate; forming a second insulating layer on a side of the data line layer distal to the base substrate; forming a first via and a second via extending through the second insulating layer; forming a repair line on a side of the second insulating layer distal to the data line layer; forming a first insulating layer on a side of the repair line distal to the second insulating layer; and forming a gate line layer including a plurality of rows of gate lines on a side of the first insulating layer distal to the repair line. The plurality of rows of gate lines are formed to cross over the plurality of columns of data lines, thereby defining a plurality of subpixels. The data line repair line is formed to be electrically connected to the corresponding one of the plurality of columns of data lines through the first via and the second via, respectively.

In some embodiments, the repair line is a gate line repair line. Optionally, the first signal line layer is a data line layer including a plurality of rows of data lines, and the second signal line layer is a gate line layer including a plurality of columns of gate lines. Optionally, the array substrate is an array substrate having a bottom gate type thin film transistor. Optionally, the method includes forming a gate line layer including a plurality of columns of gate lines on the base substrate; forming a second insulating layer on a side of the gate line layer distal to the base substrate; forming a first via and a second via extending through the second insulating layer; forming a repair line on a side of the second insulating layer distal to the gate line layer; forming a first insulating layer on a side of the repair line distal to the second insulating layer; and forming a data line layer including a plurality of rows of data lines on a side of the first insulating layer distal to the repair line. The plurality of columns of gate lines are formed to cross over the plurality of rows of data lines defining a plurality of subpixels. The gate line repair line is formed to be electrically connected to the corresponding one of the plurality of columns of gate lines through the first via and the second via, respectively.

In some embodiments, the repair line is a gate line repair line. Optionally, the signal line layer is a data line layer including a plurality of rows of data lines, and the second signal line layer is a gate line layer including a plurality of columns of gate lines. Optionally, the array substrate is an array substrate having a top gate type thin film transistor. Optionally, the method includes forming a data line layer including a plurality of rows of data lines on a base substrate; forming a first insulating layer on a side of the data line layer distal to the base substrate; forming a repair line on a side of the first insulating layer distal to the data line layer; forming a second insulating layer on a side of the repair line distal to the first insulating layer; forming a first via and a second via extending through the second insulating layer; and forming a gate line layer including a plurality of columns of gate lines on a side of the second insulating layer distal to the repair line. The plurality of columns of gate lines are formed to cross over the plurality of rows of data lines defining a plurality of subpixels. The gate line repair line is formed to be electrically connected to the corresponding one of the plurality of columns of gate lines through the first via and the second via, respectively.

In some embodiments, the method includes forming a plurality of the repairs lines between the first insulating layer and the second insulating layer. Optionally, the method includes forming one repair line per subpixel in the array substrate. Optionally, the method includes forming one repair line per pixel in the array substrate, each pixel includes a plurality of subpixels. Optionally, the method includes forming one repair line per multiple subpixels, e.g., one repair line per 2, 3, 4, 6, 8, or more subpixels. Optionally, the method includes forming one repair line per multiple pixels, e.g., one repair line per 2, 4, 8, 10, or more pixels.

Accordingly, the method includes forming a plurality of first vias and second vias corresponding to the plurality of the repair lines. Each of the plurality of first vias is formed to extend through the second insulating layer thereby exposing a repair line. Each of the plurality of second vias is formed to extend through the second insulating layer thereby exposing a repair line. Each of the plurality of the repair lines is formed to be electrically connected to a second signal line through a corresponding pair of first via and second via, respectively.

In another aspect, the present disclosure provides a display panel having an array substrate described herein or fabricated by a method described herein.

In another aspect, the present disclosure provides a display apparatus having a display panel described herein. Examples of appropriate display apparatuses include, but are not limited to, a liquid crystal display panel, an electronic paper, an organic light emitting display panel, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a first signal line layer comprising a plurality of rows of first signal lines; a second signal line layer comprising a plurality of columns of second signal lines; the plurality of rows of first signal lines crossing over the plurality of columns of second signal lines defining a plurality of subpixels;
a first insulating layer and a second insulating layer between the first signal line layer and the second signal line layer; the first insulating layer on a side of the second insulating layer proximal to the first signal line layer;
a repair line between the first insulating layer and the second insulating layer, the repair line corresponding to one of the plurality of columns of second signal lines; and
a first via and a second via extending through the second insulating layer;
wherein the repair line is electrically connected to the corresponding one of the plurality of columns of second signal lines through the first via and the second via, respectively; and
the repair line is at least partially in an inter-subpixel region of a display area of the array substrate.

2. The array substrate of claim 1, wherein the repair line is substantially parallel to the corresponding one of plurality of columns of second signal lines.

3. The array substrate of claim 1, wherein the repair line crosses over one of the plurality of rows of first signal lines; and
projections of the first via and the second via on the array substrate are on two sides of that of the one of the plurality of rows of first signal lines crossing over the repair line.

4. The array substrate of claim 1, wherein a projection of the repair line on the array substrate substantially overlaps with that of the corresponding one of the plurality of columns of second signal lines.

5. The array substrate of claim 1, wherein the repair line comprises a first portion, a second portion and a third portion;
a projection of the first via on the array substrate substantially overlaps with those of the first portion and the corresponding one of the plurality of columns of second signal lines;
a projection of the second via on the array substrate substantially overlaps with those of the second portion and the corresponding one of the plurality of columns of second signal lines; and
a projection of the third portion on the array substrate is spaced apart from that of the corresponding one of the plurality of columns of second signal lines.

6. The array substrate of claim 1, wherein the repair line crosses over one of the plurality of rows of first signal lines; the repair line comprises a first portion, a second portion and a third portion;
projections of the first via and the second via on the array substrate are on two sides of that of the one of the plurality of rows of first signal lines crossing over the repair line;
a projection of the first via on the array substrate substantially overlaps with those of the first portion and the corresponding one of the plurality of columns of second signal lines;
a projection of the second via on the array substrate substantially overlaps with those of the second portion and the corresponding one of the plurality of columns of second signal lines; and
a projection of the third portion on the array substrate is spaced apart from that of the corresponding one of the plurality of columns of second signal lines.

7. The array substrate of claim 1, comprising a plurality of the repairs lines between the first insulating layer and the second insulating layer; and
a plurality of first vias and second vias corresponding to the plurality of the repair lines;
wherein each of the plurality of first vias extends through the second insulating layer; each of the plurality of second vias extends through the second insulating layer; and
each of the plurality of the repair lines is electrically connected to a second signal line through a corresponding pair of first via and second via, respectively.

8. The array substrate of claim 1, wherein the first signal line layer is a gate line layer comprising a plurality of rows of gate lines; and the second signal line layer is a data line layer comprising a plurality of columns of data lines.

9. The array substrate of claim 1, wherein the first signal line layer is a data line layer comprising a plurality of rows of data lines; and the second signal line layer is a gate line layer comprising a plurality of columns of gate lines.

10. A display panel, comprising an array substrate of claim 1.

11. A display apparatus, comprising a display panel of claim 10.

12. A method of repairing a signal line short circuit in an array substrate;
the array substrate comprises:
a first signal line layer comprising a plurality of rows of first signal lines; a second signal line layer comprising a plurality of columns of second signal lines; the plurality of rows of first signal lines crossing over the plurality of columns of second signal lines defining a plurality of subpixels;
a first insulating layer and a second insulating layer between the first signal line layer and the second signal line layer; the first insulating layer on a side of the second insulating layer proximal to the first signal line layer;
a repair line between the first insulating layer and the second insulating layer, the repair line corresponding to one of the plurality of columns of second signal lines; and
a first via and a second via extending through the second insulating layer;
wherein the repair line is electrically connected to the corresponding one of the plurality of columns of second signal lines through the first via and the second via, respectively;
the repair line at least partially extends through an inter-subpixel region of a display area of the array substrate;
the repair line crosses over one of the plurality of rows of first signal lines; and
projections of the first via and the second via on the array substrate are on two sides of that of the one of the plurality of rows of first signal lines crossing over the repair line;
the method comprising repairing the signal line short circuit between the corresponding one of the plurality of columns of second signal lines and the one of the plurality of rows of first signal lines crossing over the repair line by electrically disconnecting the corresponding one of the plurality of columns of second signal lines from the one of the plurality of rows of first signal lines crossing over the repair line.

13. The method of claim 12, wherein the step of electrically disconnecting comprises cutting the corresponding one of the plurality of columns of second signal lines at a first cutting position and a second cutting position;
a projection of the first cutting position on the array substrate is between those of the first via and the one of the plurality of rows of first signal lines crossing over the repair line; and
a projection of the second cutting position on the array substrate is between those of the second via and the one of the plurality of rows of first signal lines crossing over the repair line.

14. The method of claim 13, wherein the repair line crosses over one of the plurality of rows of first signal lines; the repair line comprises a first portion, a second portion and a third portion;
projections of the first via and the second via on the array substrate are on two sides of that of the one of the plurality of rows of first signal lines crossing over the repair line;
a projection of the first via on the array substrate substantially overlaps with those of the first portion and the corresponding one of the plurality of columns of second signal lines;
a projection of the second via on the array substrate substantially overlaps with those of the second portion and the corresponding one of the plurality of columns of second signal lines;
a projection of the third portion on the array substrate is spaced apart from that of the corresponding one of the plurality of columns of second signal lines; and
projections of the first cutting position and the second cutting position on the array substrate overlap with that of the third portion, respectively.

15. The method of claim 13, wherein the signal line short circuit is a data-gate short circuit between a gate line and a data line; and
the corresponding one of the plurality of columns of second signal lines and the one of the plurality of rows of first signal lines crossing over the repair line are two different signal lines selected from a gate line and a data line.

16. A method of fabricating an array substrate, comprising:
forming a first signal line layer comprising a plurality of rows of first signal lines; and a second signal line layer comprising a plurality of columns of second signal lines; the plurality of rows of first signal lines crossing over the plurality of columns of second signal lines defining a plurality of subpixels;
forming a first insulating layer and a second insulating layer between the first signal line layer and the second signal line layer; the first insulating layer on a side of the second insulating layer proximal to the first signal line layer;
forming a repair line between the first insulating layer and the second insulating layer, the repair line corresponding to one of the plurality of columns of second signal lines; and
forming a first via and a second via extending through the second insulating layer;
wherein the repair line is formed to be electrically connected to the corresponding one of the plurality of columns of second signal lines through the first via and the second via, respectively; and
the repair line is formed to be at least partially in an inter-subpixel region of a display area of the array substrate.

17. The method of claim 16, comprising sequentially:
forming a first signal line layer comprising a plurality of rows of first signal lines on a base substrate;
forming a first insulating layer on a side of the first signal line layer distal to the base substrate;
forming a repair line on a side of the first insulating layer distal to the first signal line layer;
forming a second insulating layer on a side of the repair line distal to the first insulating layer;
forming a first via and a second via extending through the second insulating layer; and forming a second signal line layer comprising a plurality of columns of second signal lines on a side of the second insulating layer distal to the repair line; the plurality of rows of first signal lines crossing over the plurality of columns of second signal lines defining a plurality of subpixels.

18. The method of claim 16, comprising sequentially:
forming a second signal line layer comprising a plurality of columns of second signal lines on a base substrate;
forming a second insulating layer on the second signal line layer;
forming a first via and a second via extending through the second insulating layer;
forming a repair line on a side of the second insulating layer distal to the second signal line layer;
forming a first insulating layer on a side of the repair line distal to the second insulating layer; and
forming a first signal line layer comprising a plurality of rows of first signal lines on a side of the first insulating layer distal to the repair line; the plurality of rows of first signal lines crossing over the plurality of columns of second signal lines defining a plurality of subpixels.

19. The method of claim 16, wherein the first signal line layer is a gate line layer comprising a plurality of rows of gate lines; and the second signal line layer is a data line layer comprising a plurality of columns of data lines.

20. The method of claim 16, wherein the first signal line layer is a data line layer comprising a plurality of rows of data lines; and the second signal line layer is a gate line layer comprising a plurality of columns of gate lines.

* * * * *